United States Patent [19]
Sengupta et al.

[11] Patent Number: 6,071,555
[45] Date of Patent: Jun. 6, 2000

[54] FERROELECTRIC THIN FILM COMPOSITES MADE BY METALORGANIC DECOMPOSITION

[75] Inventors: Somnath Sengupta, Warwick; Steven Stowell, Harve De Grace; Louise Sengupta, Warwick; Pooran C. Joshi, Aberdeen, all of Md.; Sasangan Ramanathan, San Ramon, Calif.; Seshu B. Desu, Blacksburg, Va.

[73] Assignee: The United States of America as represented by the Secretary of the Army, Washington, D.C.

[21] Appl. No.: 09/192,619

[22] Filed: Nov. 5, 1998

[51] Int. Cl.[7] ................................. B05D 3/02; B05D 3/12
[52] U.S. Cl. .................. 427/126.3; 427/240; 427/376.2; 427/419.2
[58] Field of Search .............................. 427/126.1, 240, 427/126.3, 376.2, 419.2

[56] References Cited

U.S. PATENT DOCUMENTS

| | | |
|---|---|---|
| 5,427,988 | 6/1995 | Sengupta et al. . |
| 5,614,018 | 3/1997 | Azuma et al. ............................. 117/68 |
| 5,625,587 | 4/1997 | Peng et al. . |
| 5,766,697 | 6/1998 | Sengupta et al. . |

OTHER PUBLICATIONS

Joshi et al., "Characterization of Ba0.6Sr0.4TiO3 Thin Films with Mg Additive Fabricated by Metalorganic Decomposition Technique", Integrated Ferroelectrics, vol. 19, pp. 141–148, Jun. 1998.

"Characterization of $Ba_{0.6}Sr_{0.4}TiO_3$ Thin Films with Mg Additive Fabricated by Metalogganic Decomposition Technique," P.C. Joshi, S. Ramanathan, S.B. Desu, S. Stowell and S. Sengupta, Jun. 1998. *Integrated Ferroelectrics* vol. 19, pp. 141–148.

*Primary Examiner*—Shrive Beck
*Assistant Examiner*—Michael Barr
*Attorney, Agent, or Firm*—Paul S. Clohan, Jr.; U. John Biffoni

[57] ABSTRACT

Thin films of ferroelectric composite material comprising barium strontium titanate (BSTO) combined with magnesium oxide additive are produced by metalorganic decomposition. The barium strontium titanate magnesium oxide ferroelectric composite comprises $Ba_{1-x}Sr_xTiO_3/MgO$, wherein x is greater than 0.0 but less than or equal to 0.75 and preferably is 0.4, and wherein the weight ratio of BSTO to magnesium oxide may range from 99 to 40 weight percent BSTO to 1 to 60 weight percent magnesium oxide. These films have desirable electronic properties and may have application to both active microwave and dynamic random access memory devices, including low dielectric constant, low loss factor, high tunability, and high resistivity. The films produced are uniformly thick and impurity free, with thicknesses of only 0.4 microns.

11 Claims, 2 Drawing Sheets

FERROELECTRIC THIN FILM COMPOSITES MADE BY METALORGANIC DECOMPOSITION

GOVERNMENT INTEREST

The invention described herein may be manufactured, used and/or licensed by or or the United States Government.

FIELD OF THE INVENTION

The present invention pertains generally to methods of making thin films of ceramic ferroelectric composite materials. More particularly, the present invention is directed to a method of making thin films of Barium Strontium Titanium Oxide (Barium Strontium Titanate)/Oxide composites. Barium Strontium Titanate has the general formula, $Ba_{1-x}Sr_xTiO_3$ ($BaTiO_3$—$SrTiO_3$), and is also referred to herein simply as BSTO. Most particularly, the present invention comprises a method of making thin films of BSTO/MgO ferroelectric composites using a metalorganic decomposition process and wherein the resulting thin films are two-phase, i.e., the BSTO and MgO are distinct constituents of the film.

BACKGROUND OF THE INVENTION

Barium strontium titanate, also referred to herein as BSTO, has been known to be used for its high dielectric constant (approximate range from 200 to 6,000) in various antenna applications. This is set forth by Richard W. Babbitt et al. in their publication entitled, "Planar Microwave Electro-Optic Phase Shifters," Microwave Journal, Volume 35 (6), June 1992. This publication concluded that a need existed for materials having more desirable electronic properties.

To address this need, BSTO has been combined with various oxide additives such as MgO, $Al_2O_3$, ZnO, $ZrO_2$, and magnesium based compounds $MgZrO_3$, $MgAl_2O_4$, and $MgTiO_3$. See, for example, U.S. Pat. Nos. 5,312,790; 5,427,988; 5,486,491; 5,635,433; and, 5,635,434 hereby incorporated by reference herein.

Although various types of these ferroelectric composite materials are known, prior art methods of making these materials are not conducive to the use of these types of materials in ferroelectric phase shifter antenna applications at high frequencies, i.e., 30 GHz and upwards. In these applications, it is desirable to have the ferroelectric material in thin films having a thickness of 1 micron ($\mu$m) or less. It is difficult to polish ceramics of these thicknesses and at the same time handle them properly for insertion into a given device.

As such, there exists a need for the fabrication of ferroelectric composite materials having improved electronic properties and also having the thin film structure ideal for use, for example, in multilayer capacitors, capacitor-varistors, semiconductor devices such as dynamic and non-volatile random access memory (DRAM) computer memory cells, or for use in phased array antenna systems. There is also a need in the multilayer ceramic capacitor market for the ability to fabricate these materials in forms that may assist in increasing the component density of the circuit. Thus, there is a growing need for miniaturization, large capacitance and low cost in this market.

A variety of techniques have been used for the deposition of ferroelectric thin films. In general, the thin film deposition can be divided into two major categories: (1) physical vapor deposition (PVD); and (2) chemical processes. Among the PVD techniques, the most common methods used for the deposition of ferroelectric thin films are electron beam evaporation, rf diode sputtering, rf magnetron sputtering, dc magnetron sputtering, ion beam sputtering, molecular beam epitaxy (MBE), and laser ablation. The chemical processes can be further divided into two groups, i.e., metalorganic chemical vapor deposition (MOCVD), and wet chemical processes including sol-gel process and metalorganic decomposition (MOD).

The advantages of the wet chemical process are: (1) molecular homogeneity; (2) relatively high deposition rate throughput; (3) good composition control; (4) easy introduction of dopants; and (5) low capital cost since deposition can be done in ambient condition so that no vacuum processing is needed. The major problems due to this wet process are: (1) film cracking during post annealing process; and (2) possible contamination which results in difficulty in incorporating this technique into semiconductor processing. However, because it provides a fast and easy way to produce complex oxide thin films, this wet chemical process has a very important role in the investigation of the interrelationship among the processing, the microstructure, and the property of the films. See, for example, U.S. Pat. No. 5,625,587.

The deposition of BSTO/MgO composite in thin film form has been demonstrated by the pulsed laser deposition (PLD) method in U.S. Pat. No. 5,766,697. However, it has not been suggested in the prior art that the MOD process may be used to produce thin films of BSTO/Oxide composites in two-phase and having improved electronic properties. Moreover, particulate-free large area deposition is generally not possible, or is at least difficult, by the pulsed laser deposition technique and the uniformity of the thin films deposited by pulsed laser deposition decreases with increasing surface area. The present invention presents for the first time a method of making thin films of BSTO/MgO, wherein the electrical properties of the thin films are greatly changed by the addition of magnesium and the addition of magnesium also results in a secondary phase in the film.

SUMMARY OF THE INVENTION

Accordingly, it is an object of the present invention to provide a ferroelectric thin film and a method of making ferroelectric material in thin film form suitable for, but not limited to, use in phased array antenna systems.

It is a further object of the present invention to provide an economical method for producing thin films of BSTO/Oxide composites having desirable electronic properties such as decreased dielectric constant, high tunability, and low electronic loss, as well as exhibiting low leakage current (in pA range) while maintaining substantial capacitance (hundreds of pF).

It is a further object of the present invention to provide an economical method of producing thin films of BSTO/MgO composite materials having improved electronic properties and wherein the thin film comprises a two-phase film of the BSTO and MgO constituents.

Other objects of and advantages of the present invention will become apparent as a description thereof proceeds.

In satisfaction of the foregoing objects and advantages, the present invention provides a method of making a thin film ferroelectric composite material having a composition comprising: barium strontium titanate (BSTO), said barium strontium titanate represented as $Ba_{1-x}Sr_xTiO_3$, wherein x is greater than 0.0 but less than or equal to 0.75; and a metal oxide comprising magnesia (MgO); wherein said barium strontium titanate and said magnesia are present in effective amounts to provide a composite having a low dielectric constant, low electronic loss (low loss tangent), and high tunability.

Preferably, according to the method, a metalorganic decomposition method is used wherein the oxide additive comprises magnesium oxide.

DESCRIPTION OF THE PREFERRED EMBODIMENTS

Figure 1:
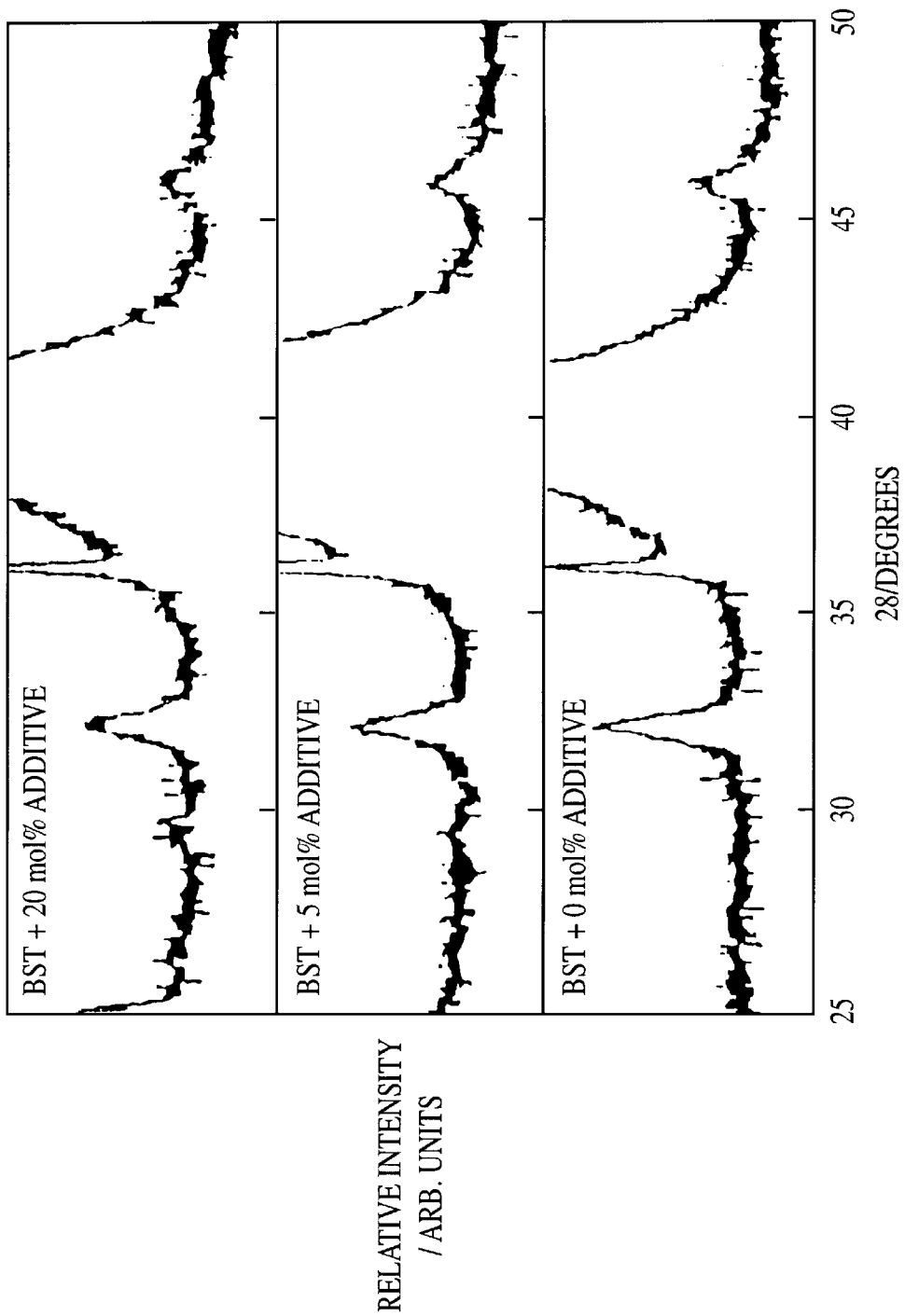
FIG. 1 shows an x-ray diffraction (XRD) pattern for BSTO thin films having different amounts of magnesium oxide additive.

The subject matter of the present invention relates to fabrication of specific ferroelectric materials in thin film form having sought-after properties in, for example, phased array antenna systems or dynamic random access memory (DRAM) devices. These sought-after properties include: (1) a decreased dielectric constant; (2) high tunability; and (3) low electronic loss or low loss tangent (tan $\delta$). Dielectric constant is related to the energy storage in the material; whereas the loss tangent is related to the power dissipation in the same material. Tunability may be define as (dielectric constant with no applied voltage)-(dielectric constant with an applied voltage)/(dielectric constant with no applied voltage). For simplicity purposes, tunability can be represented as T $$T=(X-Y)/X$$

wherein,

X=dielectric constant with no applied voltage; and
Y=dielectric constant with an applied voltage.

The tunability of a material under an electric field of 70.0 kV/cm can range from 1% to 60% depending upon the materials employed.

The materials described herein are barium strontium titanate (BSTO) combined with magnesium oxide (MgO) (hereafter referred to as BSTO/MgO); and more particularly thin film forms of said materials having a thickness of about 0.4 microns.

The present invention encompasses the fabrication of thin film ferroelectric composite materials having enhanced electronic properties. The method of making the thin films disclosed herein is superior in that it is more economical than pulsed laser deposition methods, and in that it produces particulate-free, uniformly thick, large-area depositions of two-phase BSTO/MgO composites. "Two-phase" film means that the film comprises a mixture of the constituents, for example, BSTO and MgO, wherein the constituent parts are distinct from one another, i.e., the film is not homogeneous in make-up.

When one considers the optimization in the electronic properties of ceramic materials, the following parameters must be taken into consideration:

(1) Dielectric Constant: Ideally the dielectric constant should be low, ranging from approximately 30 to 1,500. This dielectric constant range does not decrease the phase shifting ability of the material if a sufficient thickness of the film material is used (then a high dielectric constant is not needed). As insertion loss (loss of energy getting into the thin film) does not depend upon the dielectric constant, insertion loss is not affected by lowering the dielectric constant. Also, since the loss tangent (tan $\delta$) increases with increasing dielectric constant for these ferroelectric materials, lower dielectric materials tend to have lower loss tangents and, therefore, less insertion loss.

(2) High Tunability: The tunability of a particular material affects the material's electronic properties by how much the dielectric constant changes with applied voltage. The degree of phase shifting ability is directly related to the tunability; therefore, higher tunabilities are desired. The tunability can be increased in the case of thin film materials by depositing thinner submicron layers of the materials. The insertion loss is inversely related to the tunability so that the larger the tunability, the smaller the insertion loss. Optimum electronic properties would have tunabilities ranging from 4 to 50% (depending upon the dielectric constant and the loss tangent (tan $\delta$)).

(3) Low Electronic Loss: The loss tangent (intrinsic to the material) serves to dissipate or absorb the incident microwave energy and therefore is most effective in this device when the loss tangent (tan $\delta$) is in the range of 0.001 or less. The low loss tangent serves to decrease the insertion loss and hence increase the phase shifting per decibel of loss. The loss tangent controls the operating frequency.

The materials within the scope of the present invention fall within the optimum characteristics as described above. These materials comprise BSTO/Oxide composites, for example, $Ba_{1-x}Sr_xTiO_3$/MgO, wherein x is greater than 0.0 but less than or equal to 0.75. This formulation may be referred to as barium strontium titanate (BSTO) and magnesia. The weight ratios of BSTO to magnesia may range from 99 to 40 weight % BSTO to 1 to 60 weight % magnesia. A typical composition within the present invention may comprise 80% by weight BSTO (wherein x=0.40) and 20% by weight magnesia (MgO).

Magnesia is used herein to adjust the electronic properties of BSTO. The structural and electronic properties of the BSTO thin films were greatly changed by additions of magnesium. The surface morphology of the films produced was smooth with a dense microstructure. The typical small signal dielectric constant and the loss factor (tan $\delta$) for a 0.40 $\mu$m thick undoped BSTO film were 450 and 0.013, respectively, at an applied frequency of 100 kHz. The loss factor (tan $\delta$) was significantly reduced by the addition of magnesium content, while the tunability ($\Delta C/C_o$) was found to change from 20.7% to 5.8% as the magnesium additive was changed from 0 to 20 mole %. The thin film formulation herein can be adjusted for use in any discrete element phase shifter design, such as planar microstrip, wave guide geometries of for use in a parallel plate structure. The films exhibited high resistivity of the order of $10^{12}$ $\Omega$-cm even up to an applied electric filed of 100 kV/cm.

Thin films of BSTO with MgO additive were fabricated by a metalorganic decomposition (MOD) technique.

EXAMPLE 1

This example will describe a typical thin film fabrication technique using the MOD process. Thin films of BST with Mg additive were fabricated by the metalorganic decomposition (MOD) process using barium acetate, strontium acetate, titanium isopropoxide, and magnesium methoxide as precursors. All these precursor chemicals were obtained from Strem Chemicals, Inc., located in Newburyport, Mass. Acetic acid and 2-methoxyethanol were used as solvents.

Barium acetate and strontium acetate were initially dissolved in glacial acetic acid. Titanium isopropoxide was added to this mixture with constant stirring. Magnesium methoxide (7.4 wt. % in methanol) was dissolved in 2-methoxyethanol and added to the final BSTO solution in various molar concentrations. Adjustments to the viscosity and surface tension of the solution were then made by further dilution with 2-methoxyethanol, improving wettability and uniformity of coating a substrate. Dust and other suspended particles or impurities were then removed form the solution by filtering through a 0.2 $\mu$m syringe filter. The precursor films were coated onto Pt-coated silicon substrates by spin coating. After coating onto various substrates, films were kept on a hot plate in air for 10 minutes to remove solvents and other organics. The as-pyrolyzed (approximately 300° C.) films were found to be amorphous and the post-deposition annealing of the films was carried out at 725° C. for a period of about 45 minutes in a tube furnace in oxygen atmosphere to impart crystallinity.

The crystallinity of the films was analyzed using a Scintag XDS 2000 diffractometer with $CuK_\alpha$ radiation at 40 kV. The surface morphology was analyzed by Digital Instruments Dimension 3000 atomic force microscope (AFM) using tapping mode with phase modulation. Electrical measurements were conducted on 0.4 $\mu$m thick films in metal-insulator-metal (MIM) configuration using platinum as the top and bottom electrodes. The dielectric measurements were conducted using Hewlett Packard HP 4192A impedance analyzer and the dc electrical conduction was analyzed by a Keithley 617 electrometer/source.

FIG. 1 shows the XRD patterns of the BSTO thin films with different amounts of magnesium oxide additive. Although no secondary phases were observed for films with low mole percentage magnesium content, a secondary phase was observed in the XRD pattern for films having 20 mole percent magnesium. This secondary phase is due to the magnesium addition.

The surface morphology of the films was smooth with no cracks and defects, and the films exhibited a dense microstructure which was greatly modified by the magnesium addition. The grain size was found to decrease with the increase in magnesium content which is consistent with XRD patterns and also reflected in the dielectric response of the films. Similar reduction in grain size has also been observed in bulk BSTO with magnesium addition.

The dielectric properties of the BSTO/MgO films were measured in terms of the dielectric constant $\epsilon_r$ and the loss factor tan $\delta$. For undoped BSTO films (for example, only 1 mole % magnesium additive), the measured small signal dielectric constant and loss factor at a frequency of 100 kHz were 450 and 0.013, respectively.

Table 1 shows the effects of magnesium content on tunability and dielectric response. Tunability is defined as $(\Delta C/C_o)$ where $\Delta C$ is the change in capacitance relative to zero-bias capacitance $C_o$ under the application of an electric field E. The high tunability of undoped BSTO thin films makes them attractive for use as phase shifter elements for microwave phase shifters; however, a low dielectric loss (loss factor) is also desired. Undoped BSTO thin films exhibited a loss factor of 0.013 up to 1 MHz under room temperature conditions. Table 1 shows that both the dielectric constant and loss factor are reduced by increased magnesium addition.

TABLE 1

Effect of Mg content on electronic properties

| Mg (mole %) | Tunability ($\Delta C/C_o$) (at E = 100 kV/cm) | Dielectric Constant (at 100 kHz) | Loss Factor (tan $\delta$) |
|---|---|---|---|
| 1 | 20.7 | 450 | 0.013 |
| 5 | 12.7 | 386 | 0.007 |
| 20 | 5.8 | 205 | 0.009 |

The films exhibited a low loss factor of 0.007 for 5 mole % magnesium content. The dielectric loss factor (tan $\delta$) did not change appreciably as the Mg content was increased up to 20 mole %. However, the tunability changed form 20.7% to 5.8% and the dielectric constant decreased form 450 to 205. Similar trends have been observed for both bulk and thin films of BSTO with magnesium oxide addition.

Figure 2:
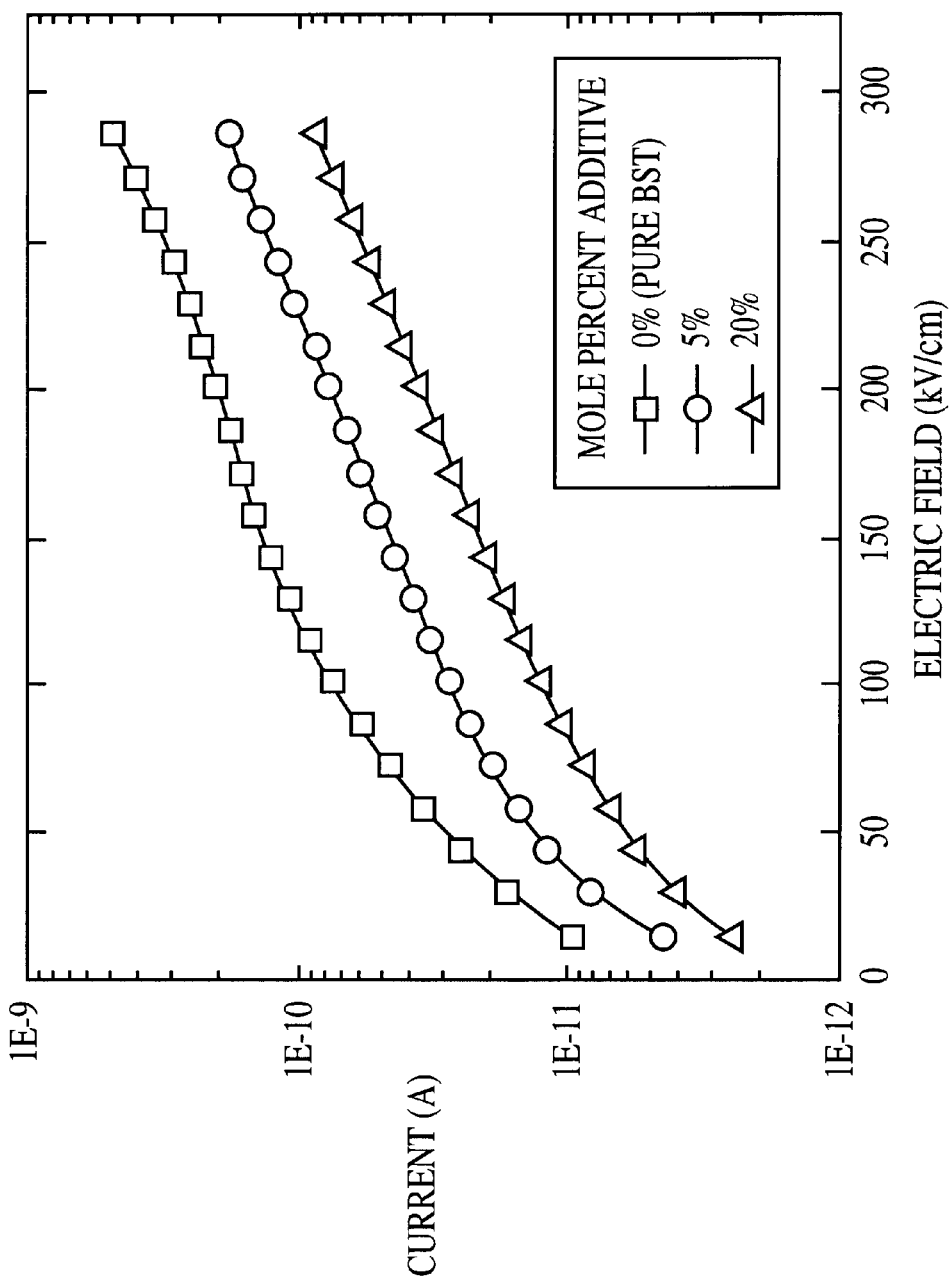
FIG. 2 is a graph showing the I-V (current-voltage) characteristics of BSTO thin films having different amounts of magnesium oxide additive.

FIG. 2 shows the current-voltage (I-V) characteristics of BSTO thin films having different amounts of magnesium addition. The leakage current characteristics were greatly improved by increased magnesium content. As the magnesium content increased from 0 to 20 mole %, the leakage current was found to decrease significantly from a value of 100 to 10 picoamperes (pA) at an applied electric field of 150 kV/cm. The film also exhibited high resistivity of the order of $10^{12}$ $\Omega$-cm at an applied field of up to 100 kV/cm.

The dielectric constant of the thin films remained greater than 200 even with up to 20 mole % magnesium addition, while the dielectric loss factor and the leakage current were significantly decreased. These results indicate that BSTO films with magnesium additions may also be attractive for DRAM applications since a DRAM cell requires a film with a high dielectric constant and low leakage current. The improvements in both the insulating behavior (lower leakage current) and the dielectric loss factor (tan $\delta$) with increasing magnesium content are encouraging for these applications.

In summary, thin films of $Ba_{0.6}Sr_{0.4}TiO_3$ with MgO additive having perovskite structure were successfully deposited on platinum coated silicon substrates by an MOD process using acetate and alkoxide precursors. The general trends of the material properties were consistent with those observed in bulk ceramics and pulse laser deposition films for MgO additions. However, a secondary phase was observed in the XRD pattern for films of 20 mole % MgO, which is due to the magnesium addition. The films exhibited good structural and electrical characteristics. The microstructure and the properties of the films were greatly changed by the addition of magnesium. The surface morphology of the films was smooth with a dense microstructure. The typical small signal dielectric constant and loss tangent for a 0.4 $\mu$m thick undoped BSTO film at a frequency of 100 kHz were 450 and 0.013, respectively. The dielectric constant and loss factor were found to decrease with an increase in Mg content. The thin films were found to be tunable by the applied electric field. The films exhibited a low loss factor of 0.007 for 5 mole % Mg additive content at 100 kHz. The leakage current was found to decrease with an increase in the Mg additive content. The films also exhibited a high resistivity of $10^{12}$ $\Omega$-cm up to an applied electric field of 100 kV/cm. The high dielectric constant, low dielectric loss, and good insulating behavior suggest that thin films of BSTO/MgO may be attractive materials for both active microwave and DRAM applications. Furthermore, the low cost and high product yield of this process offers an excellent alternative for fabricating large area BSTO/Oxide thin films for phase shifters and other novel voltage tunable applications.

While the particular embodiments of the present invention have been shown and described, it will be obvious to those skilled in the art that changes and modifications may be made without departing from this invention. It is therefore intended that the claims herein are to include all such obvious changes, modifications, and equivalents as fall within the true spirit and scope of this invention.

What is claimed is:

1. A method of making a thin film of a ferroelectric composite material having a composition comprising:

barium strontium titanate, said barium strontium titanate represented as $Ba_{1-x}Sr_xTiO_3$, wherein x is greater than 0.0 but less than or equal to 0.75, and magnesia (MgO); wherein said barium strontium titanate and said magnesia are present in amounts to provide a composite having a low dielectric constant, low loss factor, and high tunability;

the method comprising the steps of:
(a) dissolving barium acetate and strontium acetate in glacial acetic acid producing a mixture;
(b) subsequently adding titanium isopropoxide to said mixture with constant stirring producing a solution;
(c) separately dissolving magnesium methoxide in 2-methoxyethanol producing a second mixture;
(d) adding said second mixture to said solution producing a second solution;
(e) filtering said second solution to remove impurities producing a filtered solution;
(f) spin coating said filtered solution onto substrates creating a thin film on said substrates;
(g) heating said substrates to remove solvents and organics; and
(h) annealing said thin films.

2. The method of claim 1, wherein said barium strontium titanate is $Ba_{1-x}Sr_xTiO_3$ and wherein x=0.35 to 0.40.

3. The method of claim 1, wherein said amounts of barium strontium titanate and magnesia comprises a weight ratio of said barium strontium titanate to said magnesia ranging from approximately 99%–40% barium strontium titanate to approximately 1%–60% magnesia.

4. The method of claim 1, wherein said amount of magnesia present in said ferroelectric composite material comprises from about 5 mole percent to about 20 mole percent.

5. The method of claim 4, wherein said amount of magnesia comprises about 20 mole percent.

6. The method of claim 1, wherein said film comprises a two-phase composite of barium strontium titanate and magnesium oxide.

7. The method of claim 1, wherein said magnesium methoxide comprises about 7.4 weight percent in methanol.

8. The method of claim 1, further comprising adjusting the viscosity and surface tension of the second mixture by further dilution with 2-methoxyethanol.

9. The method of claim 1, wherein said filtering is conducted using 0.2 μm filters.

10. The method of claim 1, wherein said substrates comprise platinum-coated silicon substrates.

11. The method of claim 1, wherein said annealing comprises heating at about 750° C. for a period of about 45 minutes.

* * * * *